United States Patent
Manglani et al.

(10) Patent No.: US 9,001,941 B2
(45) Date of Patent: Apr. 7, 2015

(54) METHOD AND APPARATUS TO INDEPENDENTLY CONTROL FRONT END GAIN AND BASEBAND GAIN

(75) Inventors: Manish Manglani, Greensboro, NC (US); Antonio Montalvo, Raleigh, NC (US)

(73) Assignee: Analog Devices, Inc., Norwood, MA (US)

( * ) Notice: Subject to any disclaimer, the term of this patent is extended or adjusted under 35 U.S.C. 154(b) by 190 days.

(21) Appl. No.: 13/362,232

(22) Filed: Jan. 31, 2012

(65) Prior Publication Data

US 2013/0195215 A1    Aug. 1, 2013

(51) Int. Cl.
  *H04L 27/08*    (2006.01)

(52) U.S. Cl.
  CPC .................................. *H04B 17/318* (2013.01)

(58) Field of Classification Search
  CPC ..... H03G 3/20; H03G 3/3036; H03G 3/3052; H03G 3/3068; H03G 3/307; H03G 2201/202; H03G 2201/204; H03G 2201/206; H03G 2201/302; H03G 2201/3058
  USPC ............... 375/326–327, 344–345; 455/232.1, 455/245.1, 234.1
  See application file for complete search history.

(56) References Cited

U.S. PATENT DOCUMENTS

| | | | | |
|---|---|---|---|---|
| 5,303,415 | A * | 4/1994 | Takayama et al. | 455/296 |
| 5,339,454 | A * | 8/1994 | Kuo et al. | 455/247.1 |
| 5,761,190 | A * | 6/1998 | Yamauchi et al. | 370/210 |
| 6,295,017 | B1 * | 9/2001 | Ivanov et al. | 342/17 |
| 6,327,312 | B1 * | 12/2001 | Jovanovich et al. | 375/316 |
| 6,459,727 | B1 * | 10/2002 | Cho et al. | 375/222 |
| 6,625,433 | B1 * | 9/2003 | Poirier et al. | 455/232.1 |
| 6,748,200 | B1 * | 6/2004 | Webster et al. | 455/234.1 |
| 6,834,204 | B2 * | 12/2004 | Ostroff et al. | 607/2 |
| 7,120,410 | B2 * | 10/2006 | Shi | 455/226.2 |
| 7,353,010 | B1 * | 4/2008 | Zhang et al. | 455/234.1 |
| 7,369,836 | B2 * | 5/2008 | Suganuma | 455/306 |
| 7,403,757 | B2 * | 7/2008 | Yu et al. | 455/232.1 |
| 7,561,863 | B2 * | 7/2009 | Ikeda et al. | 455/232.1 |
| 7,570,465 | B2 * | 8/2009 | Beatty et al. | 361/42 |
| 7,633,727 | B2 * | 12/2009 | Zhou et al. | 361/42 |
| 7,676,208 | B2 * | 3/2010 | Lee et al. | 455/234.1 |
| 7,929,650 | B2 * | 4/2011 | Sobchak et al. | 375/345 |
| 8,055,459 | B2 * | 11/2011 | Montanari et al. | 702/58 |
| 8,086,204 | B2 * | 12/2011 | Uramoto et al. | 455/296 |

(Continued)

OTHER PUBLICATIONS

"Dual-Rate Automatic Gain Controller for WCDMA Mobile Receiver", Ser Wah Oh and Rizki M. Ridwan, authors, WCNC 2007 proceedings.

(Continued)

*Primary Examiner* — Emmanuel Bayard
(74) *Attorney, Agent, or Firm* — Kenyon & Kenyon LLP

(57) ABSTRACT

The invention may provide a receiver including a front-end block to provide a front-end gain on a radio-frequency input signal. The front-end block may include a mixer to convert the radio-frequency input signal to a baseband signal. The receiver also may include a wide-band peak detector coupled to the front-end block and a baseband block to provide a baseband gain on the baseband signal. An analog-to-digital converter may convert the baseband signal to a digital signal. The receiver may further include narrow-band peak detector coupled to an output of the analog-to-digital converter. An automatic gain control circuit may independently control the front-end gain and the baseband gain based on outputs from the wide-band peak detector and narrowband peak detector.

28 Claims, 9 Drawing Sheets

(56) References Cited

U.S. PATENT DOCUMENTS

| | | | |
|---|---|---|---|
| 8,103,234 B2* | 1/2012 | Razzell | 455/250.1 |
| 8,301,097 B2* | 10/2012 | Darabi et al. | 455/234.1 |
| 8,369,467 B2* | 2/2013 | Kajakine et al. | 375/345 |
| 8,385,539 B2* | 2/2013 | Wurz | 379/406.08 |
| 8,417,203 B2* | 4/2013 | Saito | 455/234.1 |
| 8,456,579 B2* | 6/2013 | Sano et al. | 348/678 |
| 8,559,865 B2* | 10/2013 | Weissman et al. | 455/1 |
| 8,897,344 B2* | 11/2014 | Maguire | 375/219 |
| 2002/0193958 A1 | 12/2002 | Underbrink et al. | |
| 2003/0064692 A1* | 4/2003 | Shi | 455/232.1 |
| 2003/0078007 A1* | 4/2003 | Parssinen et al. | 455/67.1 |
| 2004/0017865 A1 | 1/2004 | Litwin, Jr. et al. | |
| 2004/0043733 A1* | 3/2004 | Marrah et al. | 455/138 |
| 2004/0063413 A1* | 4/2004 | Schaffer et al. | 455/234.1 |
| 2004/0097209 A1* | 5/2004 | Haub et al. | 455/242.1 |
| 2005/0079841 A1* | 4/2005 | Astrachan et al. | 455/226.2 |
| 2005/0079842 A1* | 4/2005 | Shi | 455/232.1 |
| 2005/0094751 A1 | 5/2005 | Serizawa | |
| 2005/0147192 A1* | 7/2005 | Yamamoto et al. | 375/345 |
| 2006/0017602 A1 | 1/2006 | Puma et al. | 341/164 |
| 2006/0188042 A1* | 8/2006 | Takatz et al. | 375/345 |
| 2006/0222116 A1* | 10/2006 | Hughes et al. | 375/345 |
| 2007/0066259 A1 | 3/2007 | Ryan et al. | |
| 2007/0207762 A1 | 9/2007 | Doerrer | |
| 2007/0223631 A1* | 9/2007 | Felder et al. | 375/345 |
| 2007/0224959 A1* | 9/2007 | Hendrix et al. | 455/232.1 |
| 2008/0008198 A1* | 1/2008 | Young et al. | 370/401 |
| 2008/0181337 A1* | 7/2008 | Maxim | 375/340 |
| 2009/0135971 A1* | 5/2009 | Takatz et al. | 375/345 |
| 2009/0185642 A1* | 7/2009 | Razzell | 375/340 |
| 2009/0253376 A1* | 10/2009 | Parssinen et al. | 455/62 |
| 2009/0298454 A1 | 12/2009 | Ikeda et al. | |
| 2009/0310723 A1* | 12/2009 | Ishiguro | 375/345 |
| 2010/0079321 A1 | 4/2010 | Nentwig | |
| 2010/0156390 A1* | 6/2010 | Felder et al. | 323/369 |
| 2010/0178886 A1 | 7/2010 | Pennec et al. | |
| 2011/0059711 A1* | 3/2011 | Bjork | 455/234.1 |
| 2011/0206210 A1* | 8/2011 | Kurokawa et al. | 381/2 |
| 2012/0020388 A1* | 1/2012 | Yokoshima | 375/136 |
| 2012/0288042 A1* | 11/2012 | Chen et al. | 375/345 |
| 2012/0288043 A1* | 11/2012 | Chen et al. | 375/345 |
| 2012/0319774 A1* | 12/2012 | Ibrahim et al. | 330/129 |
| 2013/0010847 A1* | 1/2013 | Bagchi | 375/219 |
| 2013/0156134 A1* | 6/2013 | Galan et al. | 375/340 |
| 2013/0301764 A1* | 11/2013 | Shi et al. | 375/345 |

OTHER PUBLICATIONS

"A Two-Stage Digital AGC Scheme with Diversity Selection for Frame-Based OFDM Systems", Chi-Fang Li and Racy J.-H. Cheng, authors, ISCAS 2006.

International Search Report and Written Opinion issued for counterpart International Application No. PCT/US2013/023987, report dated Apr. 12, 2013.

* cited by examiner

100

| WIDEBAND PK DET | NARROWBAND PK DET | ACTION |
|---|---|---|
| 0 | 0 | Maintain/Increase FE gain, Maintain/Increase BB gain |
| 0 | 1 | Maintain FE gain, Reduce BB gain |
| 1 | 0 | Reduce FE gain, Maintain BB gain |
| 1 | 1 | Maintain FE gain, Reduce BB gain but if BB gain at minimum, then Reduce FE gain |

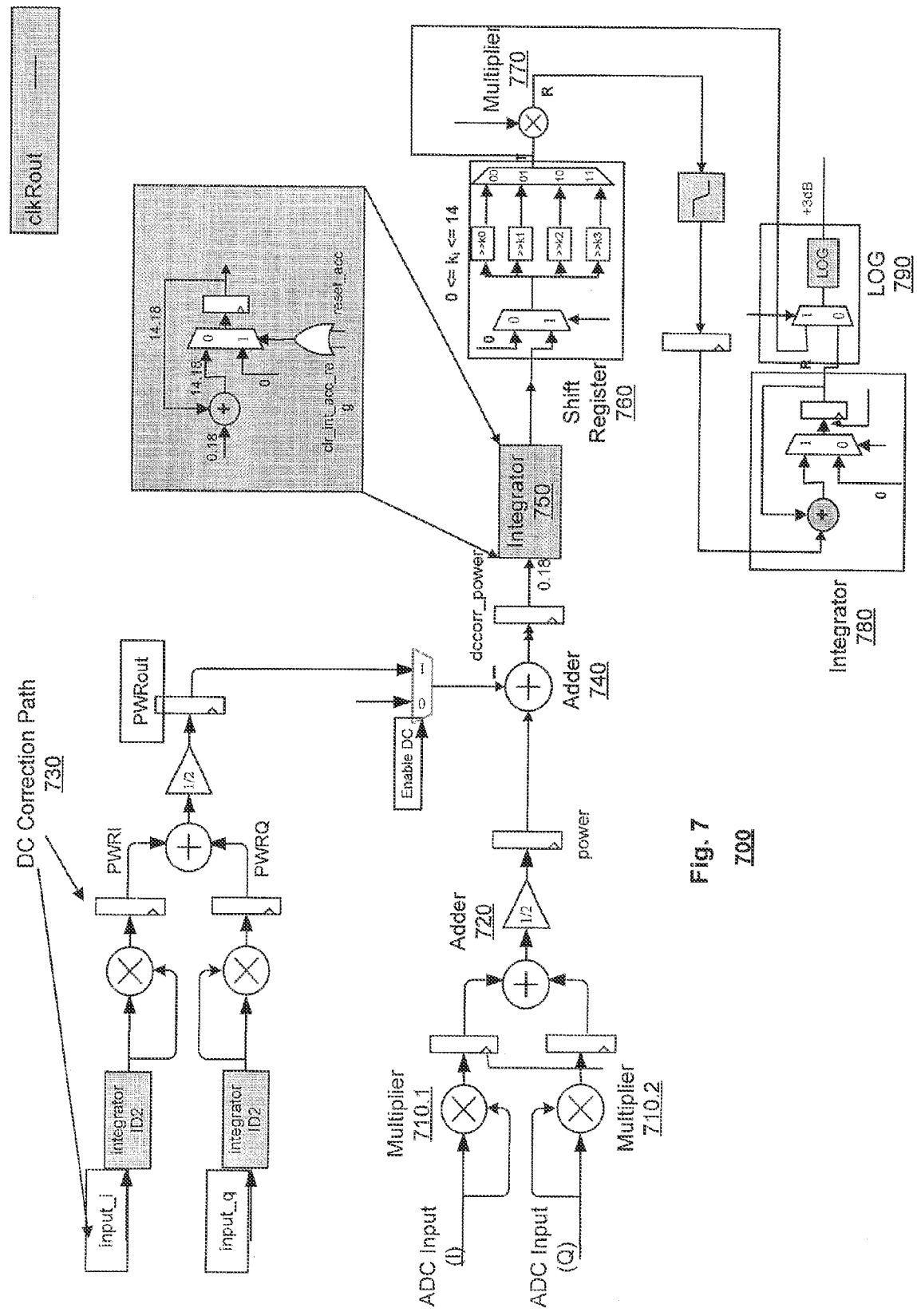

METHOD AND APPARATUS TO INDEPENDENTLY CONTROL FRONT END GAIN AND BASEBAND GAIN

BACKGROUND

The present invention relates to automatic gain control in a receiver.

Incoming signals in a wireless communication receiver can vary widely in signal strength due to a variety of factors such as distance from the transmitter, obstacles in the propagation path, interference from other signals, etc. The signal strength variations can diminish receiver operation quality. Hence, many wireless receivers employ an automatic gain control (AGC) technique to maintain incoming signal levels within a receiver's optimal operational range.

In some conventional AGC systems, a feedback path is used to control gain blocks at a front-end of the receiver. The front-end includes analog gain blocks that operate in the radio frequency (RF) band. Typically, front-end gain is maximized to obtain the lowest possible noise figure, which leads to a high signal-to-noise ratio (SNR). Out-of-band signals, however, can significantly degrade receiver performance. Out-of-band signals can drive the front-end gain blocks into an overload condition where their linearity suffers because of the front-end's larger bandwidth of operation. As a result, out-of-band signals can force the AGC to reduce the gain unnecessarily, leading to SNR degradation.

In some other conventional AGC systems, only baseband gain blocks are controlled by the AGC. Baseband blocks follow mixer(s) that down convert the RF signal to a baseband frequency. Lone baseband gain control cannot fully account for large variations in the signal strengths because of the narrow bandwidth of baseband gain blocks. Therefore, both front-end-only and baseband-only AGC systems have severe drawbacks. Even if some conventional AGC systems control both front-end and baseband gain blocks, the gain reduction mechanisms are generally static and follow a predetermined fixed profile.

Hence, the inventors perceive a need in the art for a dynamic AGC system that can control both front-end gain blocks and baseband gain blocks to optimize receiver operations.

BRIEF DESCRIPTION OF THE DRAWINGS

FIG. 2 illustrates a truth table of AGC operations according to an embodiment of the present invention.

FIG. 7 is a simplified block diagram of a power measurement device according to an embodiment of the present invention.

DETAILED DESCRIPTION

Embodiments of the present invention may provide a receiver including a front-end block to provide a front-end gain on a radio-frequency input signal. The front-end block may include a mixer to convert the radio-frequency input signal to a baseband signal. The receiver also may include a wide-band peak detector coupled to the front-end block and a baseband block to provide a baseband gain on the baseband signal. An analog-to-digital converter may convert the baseband signal to a digital signal. The receiver may further include narrow-band peak detector coupled to an output of the analog-to-digital converter. An automatic gain control circuit may independently control the front-end gain and the baseband gain based on outputs from the wide-band peak detector and narrowband peak detector.

Figure 1:
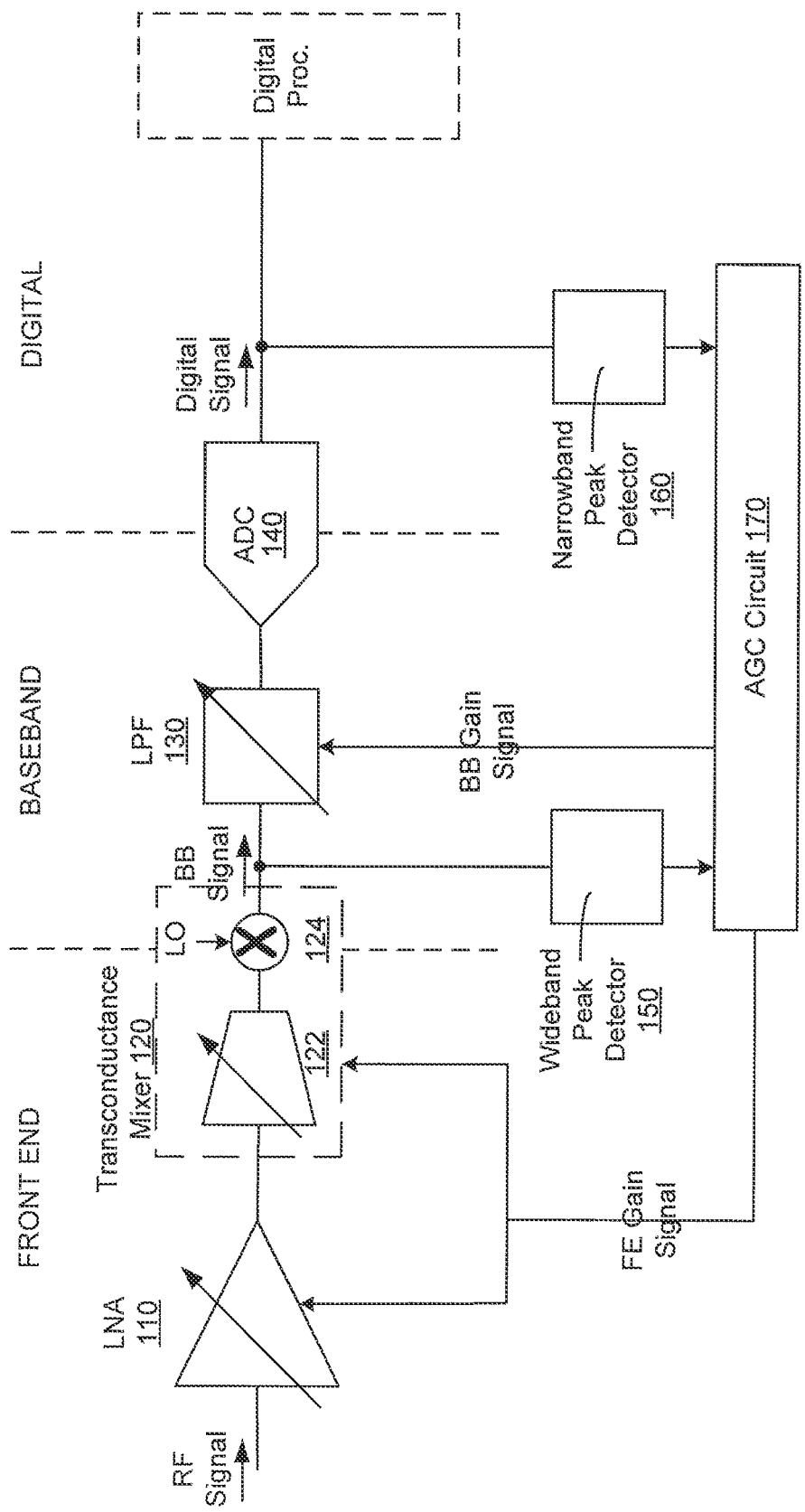
FIG. 1 is a simplified block diagram of a wireless receiver according to an embodiment of the present invention.

FIG. 1 is a block diagram of a receiver 100 according to an embodiment of the present invention. The receiver 100 may include a variable low noise amplifier (LNA) 110, a transconductance mixer 120, a variable low pass filter 130, an analog-to-digital converter (ADC) 140, a wideband peak detector 150, a narrowband peak detector 160, an AGC circuit 170, and a digital processor.

The receiver 100 may be a wireless receiver. Accordingly, an incoming RF signal may be received by an antenna (not shown) and be passed to receiver front-end components. The receiver front-end may include front-end gain blocks such as the variable LNA 110 and the transconductance mixer 120. The variable LNA 110 may amplify the RF signal according to a front-end gain level setting generated by the AGC circuit 170. The variable LNA 110 output may be coupled to a transconductance mixer 120. The transconductance mixer 120 may include a transconductance gain element 122 and a mixer 124. The transconductance gain element 122 may amplify or attenuate the RF signal according to the front-end gain level setting. The mixer 124 may be a direct conversion mixer (i.e., a homodyne mixer) and may down convert the RF signal directly to a baseband signal using a local oscillator (LO) signal.

The baseband signal output from the transconductance mixer 120 may be coupled to the variable low pass filter 130 and the wideband peak detector 150. The variable low pass filter 130, as part of a baseband gain block, may amplify or attenuate the baseband signal according to a baseband gain level setting generated by the AGC circuit 170. It also may filter the baseband signal. In an embodiment, the baseband gain block may include a TransImpedance Amplifier (TIA), a variable gain amplifier, or other like gain elements. The baseband signal may be inputted into the ADC 140. The ADC 140 may sample the baseband signal to convert the samples to a corresponding digital signal. The digital signal may be inputted into the narrowband detector 160 and to the digital processor.

The wideband peak detector 150 and the narrowband peak detector 160 may be coupled to the AGC 170. The wideband peak detector 150 may receive the baseband signal and may estimate the baseband signal's peak energy level (i.e., magnitude). The wideband peak detector 150, for example, may be an envelope detector. The wideband peak detector 150 may have the same or similar bandwidth as the front-end components of the receiver. The wideband peak detector may also contain a stored front-end threshold, for example as a voltage level. The front-end threshold may correspond to the transition point of the front-end components linear operating region and overload region. The wideband peak detector 150 may compare the baseband signal's detected energy level to the front-end threshold.

The wideband peak detector 150 may output signals representing front-end component operating conditions. For example, if the comparison shows that the peak signal level is below the front-end threshold, the wideband peak detector may generate a low (0) output to the AGC circuit 170. A low output may indicate that the front-end components such as the LNA 110 and transconductance mixer 120 are ostensibly operating in their respective linear regions. If the comparison shows that the peak signal level is above the front-end threshold, the wideband peak detector may generate a high (1) output to the AGC circuit 170. A high output may indicate that the front-end components are driven into their overload region.

The narrowband peak detector 160 may be a digital detector. The narrowband peak detector 160 may receive the digital signal generated by the ADC 140 and may estimate the digital signal's energy level. The narrowband peak detector 160 may have the same or similar bandwidth as the ADC 140, and the narrowband peak detector's bandwidth may be narrower than the wideband peak detector's bandwidth. The narrowband peak detector 160 may have a stored baseband threshold for example as a register value. The baseband threshold may correspond to a saturation point of the ADC 140. The ADC 140 may clip signals above its saturation point. The narrowband peak detector 150 may compare the digital signal's detected energy level to the baseband threshold.

The narrowband peak detector 150 may output signals representing the ADC 140 saturation level. For example, if the comparison shows that the peak signal level is below the baseband threshold, the narrowband peak detector 160 may generate a low (0) output to the AGC circuit 170. A low output may indicate that ADC is operating in its normal range. If the comparison shows that the peak signal level is above the baseband threshold, the wideband peak detector may generate a high (1) output to the AGC circuit 170. A high output may indicate that the ADC is saturated, and the digital signal is clipped.

The AGC circuit 170 may receive comparison results from both the wideband peak detector 150 and the narrowband detector 160, and the AGC circuit 170 may generate gain adjustment signals to the frontend gain blocks and baseband gain blocks independently. The AGC circuit 170, for example, may be a state machine. FIG. 2 illustrates the AGC circuit 170 operations in the form of a truth table according to an embodiment of the present invention.

In a first scenario, when both the wideband peak detector and narrowband peak detector inputs to the AGC circuit 170 are low (input: 0,0), the AGC circuit 170 may maintain both the front-end gain and baseband gain level at a current level. The detector inputs of (0,0) may indicate that the front-end components are operating in their respective linear regions and that the ADC 140 is not saturated. In another embodiment, when the detector inputs are (0,0) the AGC circuit 170 may increase either the front-end gain level or baseband gain level or both. Gain level increases will be described in further detail below.

In a second scenario, when the wideband peak detector input is low and the narrowband peak detector input is high to the AGC circuit 170 (input: 0,1), the AGC circuit 170 may maintain the front-end gain level and reduce the baseband gain level. The inputs of (0,1) may indicate that the ADC 140 is saturated while the front-end components are operating in their respective linear regions and may indicate the presence of an in-band blocking signal. Thus, the front-end gain level may be held to maintain the SNR, but the baseband gain level may be reduced to account for the in-band blocking signal. For example, the AGC circuit 170 may reduce the LPF 130 gain setting to reduce the baseband signal's energy level until the ADC 140 transitions to normal (i.e., not saturated) operations.

In a third scenario, when the wideband peak detector input is high and the narrowband peak detector is low to the AGC circuit 170 (input: 1,0), the AGC circuit 170 may reduce the front-end gain level and maintain the baseband gain level. The inputs of (1,0) may indicate that while the ADC 140 is not saturated, the front-end components are overloaded and are not operating in their respective linear regions. This particular input may indicate the presence of an out-of-band interfering signal. Thus, the front-end gain level may be reduced to transition the front-end components to operate in their respective linear regions. The baseband gain level, however, may be maintained because the out-of-band signal while adversely impacting front-end operations is not effecting the narrower bandwidth baseband operations. The AGC circuit 170, for example, may reduce the variable LNA 110 and the transconductance mixer 120 gain settings. In an embodiment of the present invention, the variable LNA 110 and transconductance mixer 120 gain settings may be adjusted separately.

In a fourth scenario, when both the wideband peak detector and narrowband peak detector inputs are high to the AGC circuit 170 (input: 1,1), the AGC circuit 170 may first maintain the front-end gain level and reduce the baseband gain level. The detector inputs of (0,0) may indicate that all components including the front end components and the ADC 140 are not operating in their respective linear regions. In response to initially reducing the baseband gain level only, if the narrowband peak detector input transitions to low (0), the AGC circuit 170 may then operate according to the above-referenced third scenario (input: 1,0). However, if the baseband gain level is reduced to its minimum level (e.g., zero) and the narrowband peak detector input remains high, the AGC circuit 170 may then reduce the front-end gain level. By initially reducing only baseband gain, the AGC circuit 170 may compensate for a possible large in-band blocking signal at the outset. Consequently, if the narrowband peak detector transitions to low, it may indicate that a large in-band blocking signal was present and was properly compensated for. Next, the AGC circuit 170 may compensate for a possible out-of-band signal by subsequently reducing the front-end gain. Thus, the above procedure may efficiently and accurately adjust for both an in-band blocking signal and out-of-band signal without significant SNR degradation.

If, however, the narrowband peak detector remains high when the baseband gain is reduced to its minimum level, it may indicate that the overall incoming signal is too large, and the front end gain is reduced accordingly.

The AGC circuit 170 may operate continuously and iteratively. The incoming signal may be continuously measured with the wideband and narrowband peak detectors, and the gain settings for the receiver may be adjusted iteratively with each new set of measurements.

Therefore, the above AGC technique of controlling the front-end and baseband gain independently optimizes receiver operations. The AGC technique independently controls both front-end and baseband components to operate in their respective linear regions without unnecessarily sacrificing SNR by separately compensating for in-band blocking signals and out-of-band signals. Moreover, the AGC technique allows for dynamically allocating gain to the front-end and baseband gain components based on existing signal conditions at a particular point in time.

Figure 3:
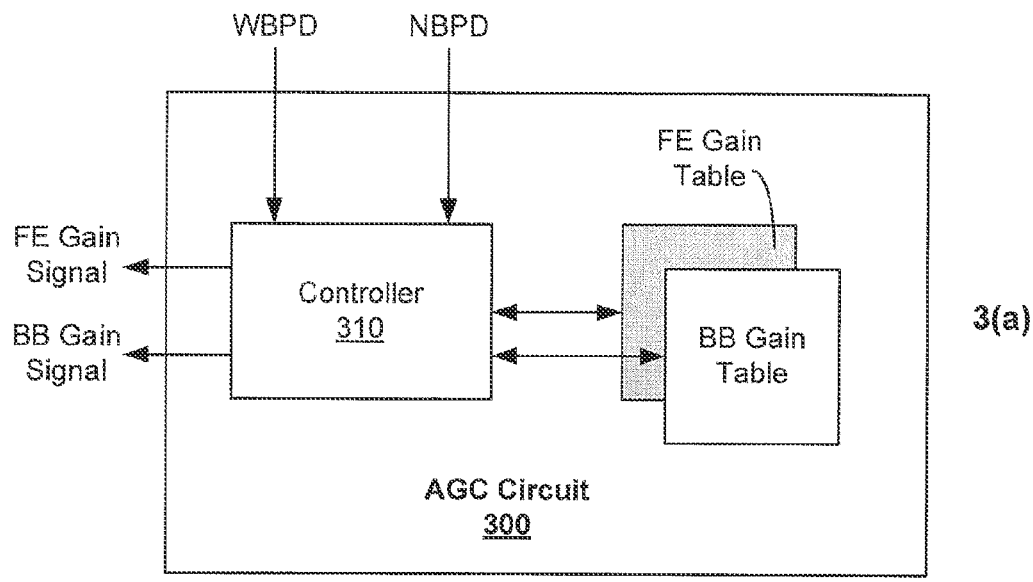
FIG. 3(a) is a simplified block diagram of an AGC circuit according to an embodiment of the present invention.
FIG. 3(b) illustrates an example of a front-end gain table according to an embodiment of the present invention.
FIG. 3(c) illustrates an example of a baseband gain table according to an embodiment of the present invention.

Front-end and baseband gains may be adjusted according to gain tables. FIG. 3(*a*) is a block diagram of an AGC circuit 300 according to an embodiment of the present invention. The AGC circuit 300 may include a controller 310 with a wideband peak detector (WBPD) input and a narrowband peak detector (NBPD) input. The AGC circuit 300 may also include front-end and baseband gain tables. The gain tables may be stored in registers or non-volatile memory (not shown) in the AGC circuit 300. The gain tables may be provided as look-up-tables (LUTs) and may be programmable.

FIGS. 3(*b*) and 3(*c*) illustrate an exemplary front-end gain table and an exemplary baseband gain table respectively according to an embodiment of the present invention. The front-end gain table may be arranged according to the variable LNA 110 and transconductance mixer 120 gain levels of FIG. 1 as shown in the table. For example, the variable LNA 110 may have four discrete gain settings (22 dB, 19 dB, 16 dB, 6 dB), and the transconductance mixer 120 may have a wider range of gain settings within each of the variable LNA 110 gain settings. A pointer may designate the current front-end gain index (FIG. 3(*b*)), and the front-end gain level may be increased/reduced by moving the pointer up/down in a stepwise fashion based on the decisions reached via the truth table of FIG. 2. Similarly, another pointer may designate the current baseband gain index (FIG. 3(*c*)), and the baseband gain level may be increased/reduced by moving the pointer up/down in a stepwise fashion based on the decisions reached via the truth table of FIG. 2.

The step size of both the front-end gain and baseband gain tables may be programmable. For example, the step size may be dynamically adjusted to account for variations in the detected energy levels. In one embodiment of the present invention, a wideband peak detector may include a plurality of thresholds that correspond to different levels of linear operation (e.g., upper level, lower level, etc.,). Further, the step size in the front-end gain table may vary based on the plurality of threshold crossings. In one embodiment of the present invention, a narrowband peak detector may include a plurality of thresholds that correspond to different levels of ADC peak detection. Further, the step size in the baseband gain table may vary based on the plurality of threshold crossings.

Figure 4:
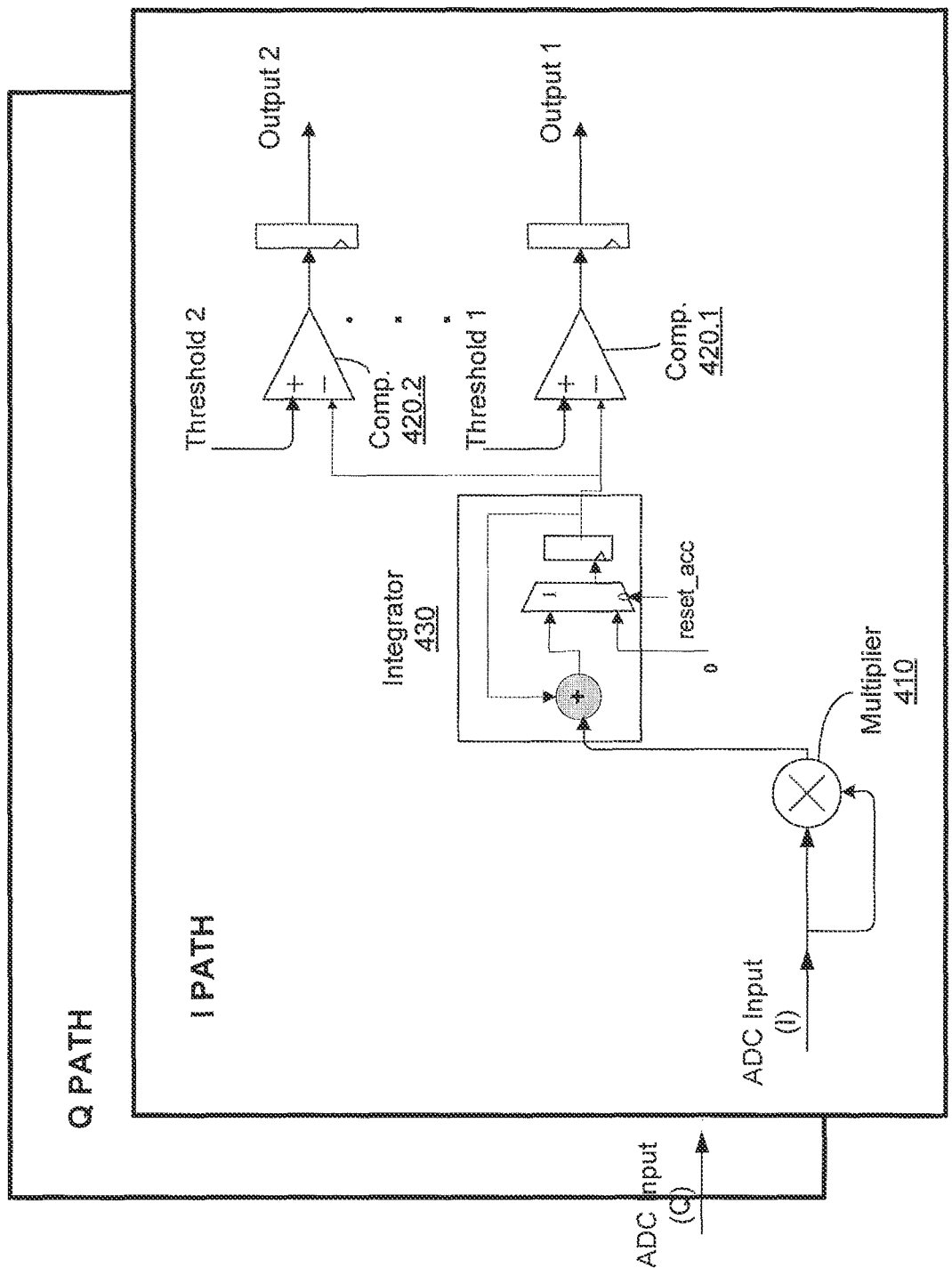
FIG. 4 is a simplified block diagram of a narrowband peak detector according to an embodiment of the present invention.

FIG. 4 illustrates a narrowband peak detector 400 with multiple threshold levels according to an embodiment of the present invention. The narrowband peak detector 400 may provide two separate and substantially identical paths for each quadrature signals (i.e., I and Q signal paths). The peak detector 400 may include a multiplier 410, a plurality of comparators 420.1, 420.2, and an integrator 430. The peak detector 400 may also include other various digital components that are not described in detail here to not obscure the objects of the present invention.

The multiplier 410 may receive an ADC input and multiply the input by itself. Thus, the multiplier output may be a squared energy value of the ADC input. The integrator 430 may accumulate the squared energy value over a programmable number of samples. For example, the number of samples may be programmable from 1 to 16 samples. The comparators 420.1, 420.2 may then compare the energy value to different thresholds. For example, comparator 420.1 may compare the energy value to a Threshold 1, which may correspond to low overload condition. Thus, the energy value exceeding Threshold 1 may indicate that the ADC is at least slightly saturated. Comparator 420.2 may compare the energy value a Threshold 2, which may correspond to a high overload condition. Thus, the energy value exceeding Threshold 2 may indicate that the ADC is highly saturated. The thresholds may be programmable. In an embodiment, the threshold bit accuracy may be related to the number to the samples. For example, threshold values may be programmable from 1 thru 256 corresponding to the programmable number of samples from 1 to 16. This particular embodiment of a peak or saturation detector may provide accurate measurement of peak signal levels when the ADC is a continuous-time sigma delta ADC, for example.

The baseband gain step size may vary according to the different saturation conditions. A high saturation condition may require a larger gain step size than a slight saturation condition to bring the ADC back into its normal operating region more quickly. For example, the high saturation condition may have a programmable gain step size of 1 dB to 16 dB, and the slight saturation condition may have a programmable gain step size of 0 dB to 7 dB. Accordingly, the AGC of the present invention may adjust the gain accurately and quickly by reducing the gain more drastically when the ADC is highly saturated as compared to when the ADC is only slightly saturated.

In an embodiment of the present invention, the step size of the front-end gain may be smaller than step size of the baseband gain because front-end gain is generally more sensitive to noise figure degradation. For example, the front-end gain step size may have a maximum of 2 dB steps while the baseband gain step size may have a maximum of 6 dB steps.

Figure 5:
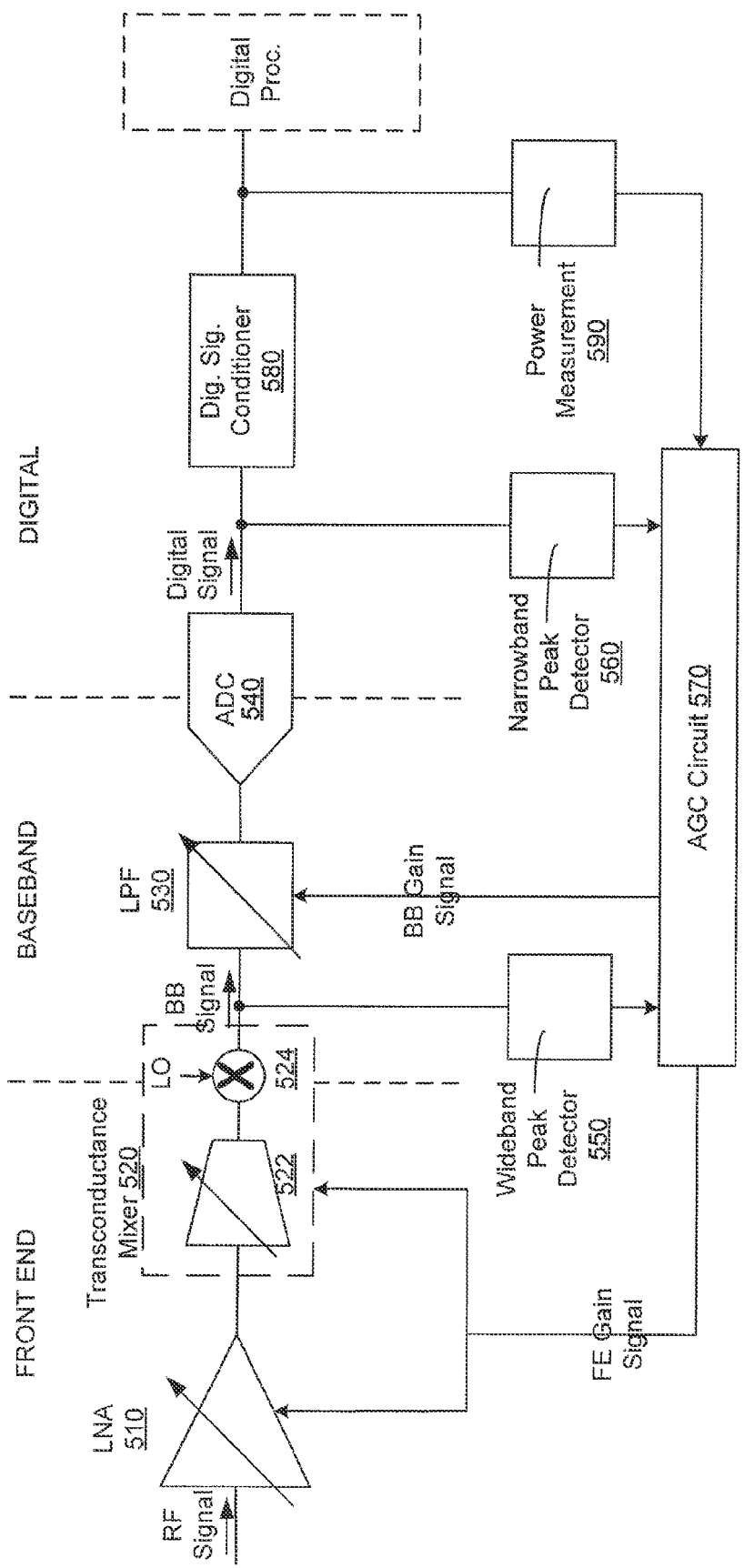
FIG. 5 is a simplified block diagram of a wireless receiver according to an embodiment of the present invention.

FIG. 5 is a block diagram of a wireless receiver 500 according to an embodiment of the present invention. The wireless receiver 500 may include may include a variable low noise amplifier (LNA) 510, a transconductance mixer 520, a variable low pass filter 530, an analog-to-digital converter (ADC) 540, a wideband peak detector 550, a narrowband peak detector 560, an AGC circuit 570, and a digital processor. These components may operate in a similar fashion as the wireless receiver 100 as described above in the discussion of FIG. 1 and FIG. 2, and their descriptions will not be repeated here.

The wireless receiver 500 may also include a digital signal conditioner 580 and a power measurement device 590. The digital signal conditioner 580 may provide digital signal processing such as filtering, amplification, and attenuation. For example, the digital signal conditioner 580 may include finite impulse response (FIR) filters. The filtering may reject a large portion of the noise component of the ADC output leading to a better SNR.

The power measurement device 590 may measure a power level of the signal at the ADC output. If the incoming signal level is not overloading the ADC or the front end (i.e., scenario 1 from FIG. 2), the AGC circuit 570 may increase either the front-end gain or baseband gain or both based on the power level. In an embodiment, the front-end gain may be increased first if permissible and then the baseband gain second if permissible. For example, the wideband peak detector output may control whether the front-end gain may be increased. In an embodiment, if the wideband peak detector threshold (e.g., lower level threshold) is not triggered, the front-end gain may be increased. However, if the wideband peak detector threshold (e.g., lower level threshold) is triggered, where the lower level threshold trigger does not correspond to unacceptable non-linear operations, the baseband gain may be increased. Furthermore, the narrowband peak detector output, for example, may control whether the baseband gain may be increased.

The gain adjustment techniques of the present invention as described herein may be implemented in a fast loop or a slow loop operation. In a fast loop operation, the gain adjustments may be performed at a detection time of a threshold trigger (e.g., WBPD trigger, NBPD trigger, Power measurement trigger). The gain adjustment, consequently, may be performed rapidly and at random times. In a slow loop operation, the gain adjustments may be performed at predetermined set times based on signal performance during preceding predetermined monitoring times. Furthermore, both fast loop and gain loop operation may be performed with a hystersis.

Figure 6A:
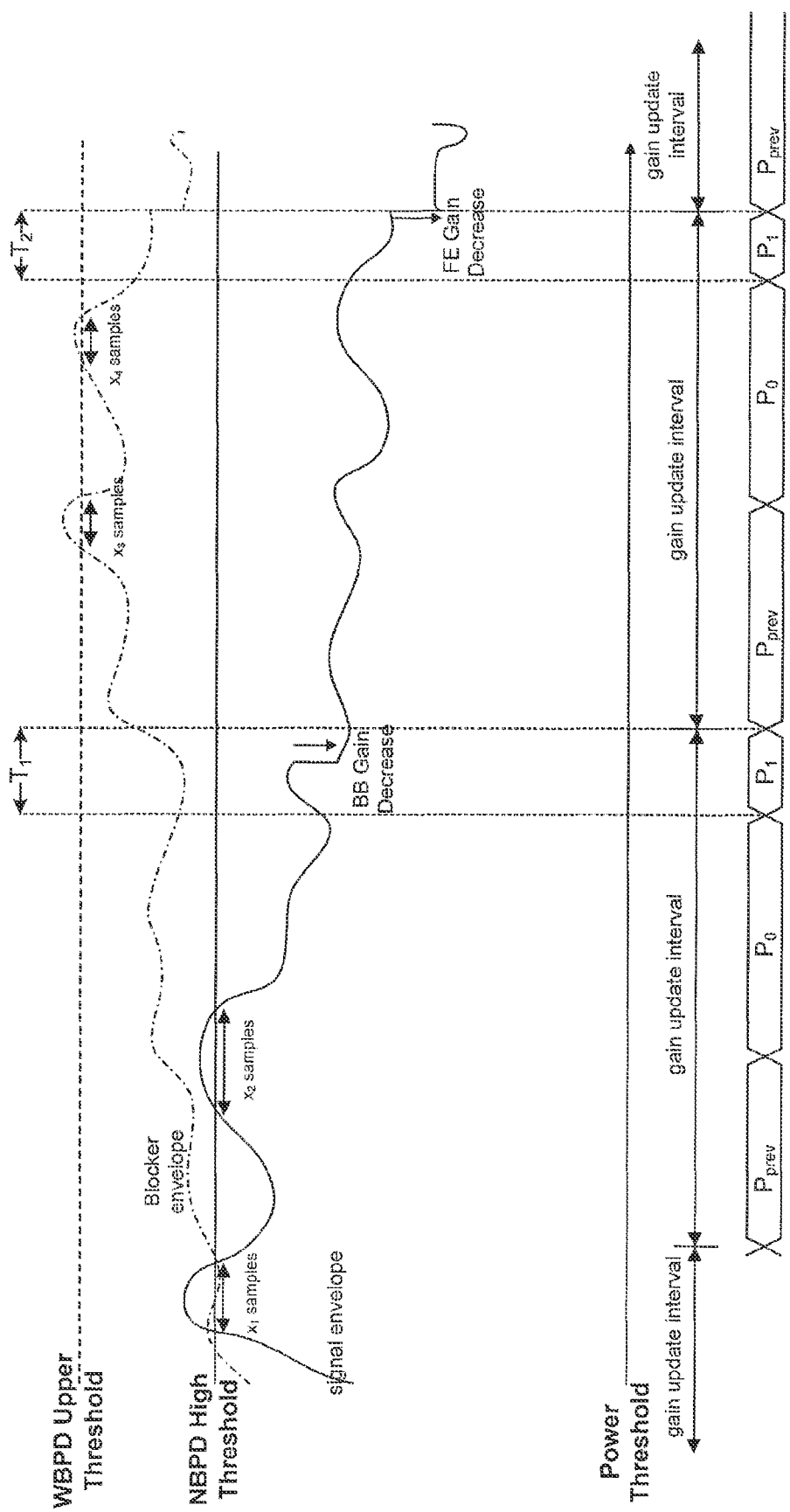
FIGS. 6(a)-6(c) illustrate exemplary timing diagrams of gain adjustment scenarios according to embodiments of the present invention.
Figure 6B:
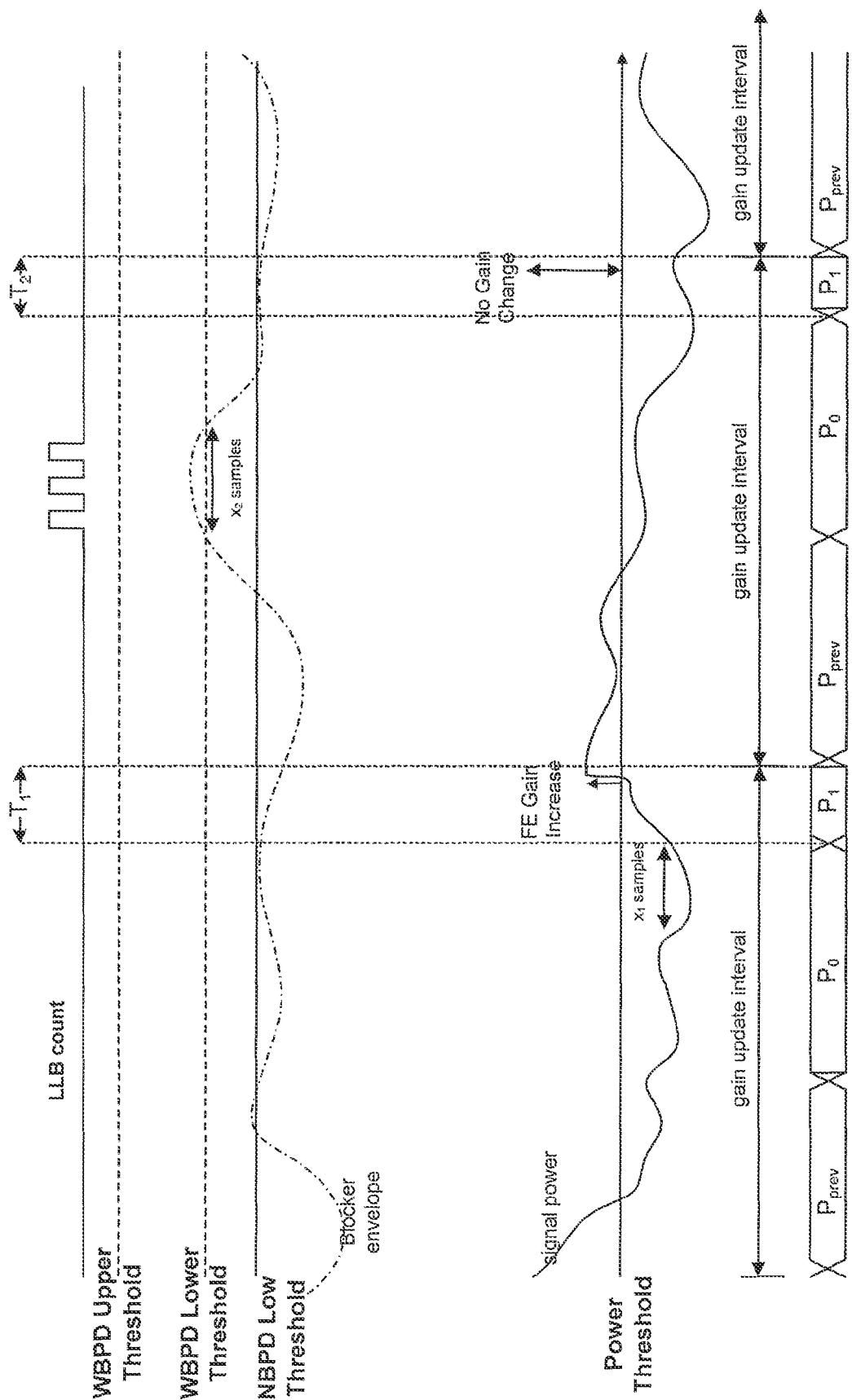
Figure 6C:
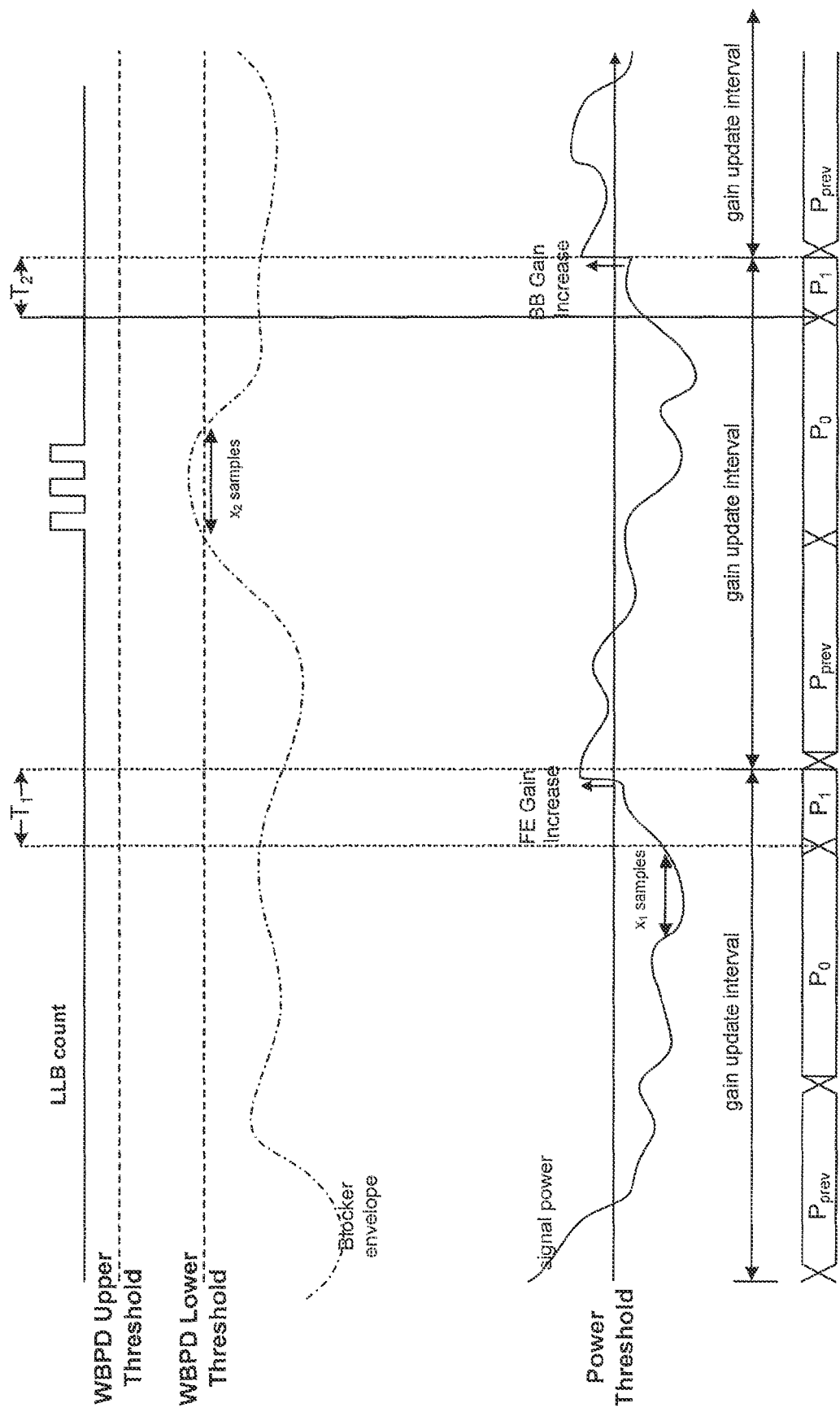

FIGS. 6(a)-6(c) show exemplary timing diagrams to illustrate some example slow loop operation scenarios. The examples are for illustrations purposes only and the present invention is not in any way limited to the example scenarios. In FIG. 6(a), the signal may trigger the NBPD high threshold in the $X_2$ sample period but may not trigger the WBPD upper threshold. Therefore, at time $T_1$, the baseband gain may be decreased. The gain changes may be performed in accordance with a step size (e.g., 2 dB). In $X_3$ and $X_4$ sample periods, the signal may trigger the WBPD upper threshold. Therefore, at time $T_2$, the front-end gain may be decreased.

In FIG. 6(b), the signal may trigger the power measurement threshold (i.e., being lower than a minimum power threshold) in the $X_1$ sample period while not triggering either the WBPD (upper or lower) or NBPD thresholds. Therefore, at time $T_1$, the front-end gain may be increased. In the $X_2$ sample period, while the signal may trigger the power measurement threshold, the signal may also trigger the WBPD lower threshold and NBPD low, threshold. Therefore, at time $T_2$, neither front-end or baseband gain may be adjusted.

In FIG. 6(c), the signal may trigger the power measurement threshold in the $X_1$ sample period while not triggering either the WBPD (upper or lower) or NBPD thresholds. Therefore, at time $T_1$, the front-end gain may be increased. In the $X_2$ sample period, while the signal may trigger the power measurement threshold, the signal may also trigger the WBPD lower threshold but not a NBPD threshold (not shown). Therefore, at time $T_2$, the baseband gain may be increased.

The power measurement device may calculate a root mean squared (RMS) power value, received signal strength indicator (RSSI), or other like values of the signal. FIG. 7 illustrates a power measurement device 700 according to an embodiment of the present invention. The power measurement device 700 may include multipliers 710.1, 710.2, an adder 720, a DC correction path 730, a DC adder 740, a first integrator 750, a shift register 760, a mulitplier 770, a second integrator 780, and a log function component 790.

The multipliers 710.1, 710.2 may receive an ADC input and multiply the input by itself. Thus, the multipliers 710.1, 710.2 output may be a, squared energy value of the ADC input. Since the squared energy value is also used in an embodiment of the narrowband peak detector, the multipliers 710.1, 710.2 may be used for both narrowband peak detector and power measurement functionality. The square of the I and Q samples may be summed (i.e., $I^2+Q^2$) by adder 720.

The power measurement may be taken from this value. The length of the power measurement may be programmable. For example, the length may vary from 16 samples up to 32768 samples. The length of the power measurement may be adjusted for the speed of the AGC operations or the desired accuracy level of the power measurement. Also, the power measurement may be used to adjust the gain level of a current burst or a subsequent burst depending on the length of burst and power measurement.

The DC correction path 730 may provide a DC correction value for the power measurement, and the DC adder 740 may insert the DC correction value if/when needed. The first integrator 750 may accumulate the samples for a programmable sample number value. The shift register 760 may shift the samples to the right by a k number of bits. For example, re k may be between 0 and 14. The multiplier 770 may multiply the shifted samples by a ratio. The second integrator 780 may then accumulate the samples and a logarithmic function may be performed by log function component 790.

The power measurement device 700 may provide a power measurement expressed as:

$$\text{RMS Power} = 10 \times \log 10\left(\frac{n_0}{N}\frac{\sum_0^{n_0-1} x_n}{n_0} + \frac{n_1}{N}\frac{\sum_0^{n_1-1} x_n}{n_1} + \ldots + \frac{n_l}{N}\frac{\sum_0^{n_l-1} x_n}{n_l}\right),$$

where $n_0$ is a number such that $n_0=2^{k_0}$, $n_1$ is a number such that $n_1=2^{k_1}$, $n_l$ is a number such that $n_l=2^{k_l}$, N is the length (in samples).

The power measurement device 700, as shown by the above equation, may calculate power measurements of sequences that are not a power of two (2) in length. For example, for a sequence of length N=15360, which is the duration of a sub-frame in LTE communication systems, the power measurement may be expressed as:

$$\text{RMS Power} = 10 \times \log 10\left(\frac{8192}{15360} \times \frac{\sum_0^{8191} x_n}{8192} + \frac{4090}{15360} \times \frac{\sum_{8192}^{12287} x_n}{4096} + \frac{2048}{15360} \times \frac{\sum_{12288}^{14335} x_n}{2048} + \frac{1024}{15360} \times \frac{\sum_{14336}^{15359} x_n}{1024}\right)$$

Those skilled in the art may appreciate from the foregoing description that the present invention may be implemented in a variety of forms, and that the various embodiments may be implemented alone or in combination. Therefore, while the embodiments of the present invention have been described in connection with particular examples thereof, the true scope of the embodiments and/or methods of the present invention should not be so limited since other modifications will become apparent to the skilled practitioner upon a study of the drawings, specification, and following claims.

Various embodiments may be implemented using hardware elements, software elements, or a combination of both. Examples of hardware elements may include processors, microprocessors, circuits, circuit elements (e.g., transistors, resistors, capacitors, inductors, and so forth), integrated circuits, application specific integrated circuits (ASIC), programmable logic devices (PLD), digital signal processors (DSP), field programmable gate array (FPGA), logic gates, registers, semiconductor device, chips, microchips, chip sets, and so forth. Examples of software may include software components, programs, applications, computer programs, application programs, system programs, machine programs, operating system software, middleware, firmware, software modules, routines, subroutines, functions, methods, procedures, software interfaces, application program interfaces (API), instruction sets, computing code, computer code, code segments, computer code segments, words, values, symbols, or any combination thereof. Determining whether an embodiment is implemented using hardware elements and/or software elements may vary in accordance with any number of factors, such as desired computational rate, power levels, heat tolerances, processing cycle budget, input data rates, output data rates, memory resources, data bus speeds and other design or performance constraints.

Some embodiments may be implemented, for example, using a computer-readable medium or article which may store an instruction or a set of instructions that, if executed by a machine, may cause the machine to perform a method and/or operations in accordance with the embodiments. Such a machine may include, for example, any suitable processing platform, computing platform, computing device, processing device, computing system, processing system, computer, processor, or the like, and may be implemented using any suitable combination of hardware and/or software. The computer-readable medium or article may include, for example, any suitable type of memory unit, memory device, memory article, memory medium, storage device, storage article, storage medium and/or storage unit, for example, memory, removable or non-removable media, erasable or non-erasable media, writeable or re-writeable media, digital or analog media, hard disk, floppy disk, Compact Disc Read Only Memory (CD-ROM), Compact Disc Recordable (CD-R), Compact Disc Rewriteable (CD-RW), optical disk, magnetic media, magneto-optical media, removable memory cards or disks, various types of Digital Versatile Disc (DVD), a tape, a cassette, or the like. The instructions may include any suitable type of code, such as source code, compiled code, interpreted code, executable code, static code, dynamic code, encrypted code, and the like, implemented using any suitable high-level, low-level, object-oriented, visual, compiled and/or interpreted programming language.

We claim:

1. A receiver, comprising:
    a front-end block to provide a front-end gain on a radio-frequency input signal, the front-end block including a mixer to convert the radio-frequency input signal to a baseband signal;
    a wide-band peak detector coupled to the front-end block;
    a baseband block to provide a baseband gain on the baseband signal;
    an analog-to-digital converter to convert the baseband signal to a digital signal;
    a narrow-band peak detector coupled to an output of the analog-to-digital converter, wherein the narrow-band detector includes at least two comparators to detect a saturation level of the analog-to-digital converter, a first comparator using a low saturation threshold and a second comparator using a high saturation threshold, wherein the low and high saturation thresholds correspond to different saturation levels of the analog-to-digital converter; and
    an automatic gain control circuit, to independently control the front-end gain and the baseband gain based on outputs from the wide-band peak detector and narrowband peak detector.

2. The receiver of claim 1, wherein the automatic gain control circuit includes
    a controller that generates a pair of indices based on the outputs from the wideband peak detector and narrowband detector;
    a first look-up-table (LUT) indexed by the first index from the controller and storing gain settings for the front-end block; and
    a second LUT indexed by the second index from the controller and storing gain settings for the baseband block.

3. The receiver of claim 2, wherein the controller increments/decrements the indices to the first and second LUTs iteratively in response to the outputs from wideband peak detector and narrowband peak detector outputs.

4. The receiver of claim 2, wherein the LUTs are provided in a programmable non-volatile memory.

5. The receiver of claim 1, wherein the analog-to-digital converter is a continuous-time sigma delta.

6. The receiver of claim 1, wherein the narrow-band peak detector includes an integrator to accumulate a programmable number of samples, and at least one comparator with a programmable threshold, wherein the number of samples is related to the threshold.

7. The receiver of claim 1, the front-end block includes a variable low noise amplifier.

8. The receiver of claim 7, wherein adjusting the front-end gain level includes adjusting gains for the variable low noise amplifier and the mixer.

9. The receiver of claim 1, further comprises a digital power detector to provide a power measurement to the automatic gain control circuit.

10. The receiver of claim 9, wherein the automatic gain control circuit adjusts the gain levels according to the power measurement if both the wide-band peak detector and narrow-band peak detector outputs are not triggered.

11. The receiver of claim 9, wherein the digital power detector measures the power of a sequence length not a power of two.

12. The receiver of claim 9, wherein the digital power detector comprises an integrator, a shift register, and a multiplier.

13. The receiver of claim 1, wherein the automatic gain control operates in a fast loop operation.

14. The receiver of claim 1, wherein the automatic gain control operates in a slow loop operation.

15. A method for automatic gain control in a receiver, comprising:
    in a first comparison, comparing a first energy level of an input signal to a front-end threshold;
    in a second comparison, comparing a second energy level of a digital representation of the input signal to saturation thresholds of an analog-to-digital converter in the receiver, wherein the second comparison includes at least two sub-comparisons, a first sub-comparison using a low saturation threshold and a second sub-comparison using a high saturation threshold, wherein the first comparison has a wider bandwidth than the second comparison; and
    adjusting gain levels independently at a front-end of the receiver and a baseband-end of the receiver based on the first and second comparisons,
    wherein the baseband gain level is reduced via a larger step size if the second energy level is above the high saturation threshold than if the second energy level is above the low saturation threshold but below the high saturation threshold.

16. The method of claim 15, wherein the adjusting comprises:
    if the first energy level is above the front-end threshold and the second energy level is below the saturation threshold, reducing the front end gain level while maintaining the baseband gain level; and
    if the first energy level is below the front-end threshold and the second energy level is above the saturation threshold, reducing the baseband gain level while maintaining the front-end gain level.

17. The method of claim 16, wherein the adjusting further comprises:
    if the first energy level is above the front-end threshold and the second energy level is above the saturation threshold, reducing the baseband gain level until the second energy level is below the saturation threshold or until the baseband gain level is at a minimum level;
and if the baseband gain level reached the minimum level, then reducing the front-end gain level.

18. The method of claim 17, wherein the adjusting further comprises:
if the first energy level is below the front-end threshold and the second energy level is below the saturation threshold, measuring a digital amplitude level and adjusting the gain levels based on the digital amplitude level.

19. The method of claim 18, wherein the measuring of the digital amplitude level includes measuring a sequence length not a power of two.

20. The method of claim 15, further comprises:
retrieving the front-end gain level from a front-end gain table and the baseband gain level from a baseband gain table and using programmable step sizes for each table.

21. The method of claim 15, wherein the adjusting is performed in a fast loop.

22. The method of claim 15, wherein the adjusting is performed in a slow loop.

23. An automatic gain control circuit, comprising:
a peak detector input;
a saturation detector input;
a non-volatile memory storing a first LUT with front-end gain settings and a second LUT with baseband gain settings, wherein the first LUT includes two sets of front-end gain settings, a first set for a first front-end gain element and a second set for a second front-end gain element;
a controller to generate a front end gain value and a baseband gain value based on the peak detector input and saturation detector input using the first and second LUTs, wherein the saturation detector input includes information about a saturation level of an analog-to-digital converter based on a low saturation threshold and a high saturation threshold;
a first output to transmit the front end gain value; and
a second output to transmit the baseband gain value.

24. The automatic gain control circuit of claim 23, wherein the peak detector input is either a high (1) or low (0) input, and the saturation detector input is either a high (1) or low (0) input.

25. The automatic gain control circuit of claim 24, wherein
when the peak detector and saturation detector inputs are (0,0) respectively, maintaining the front end gain value and maintaining the baseband gain value;
when the peak detector and saturation detector inputs are (0,1) respectively, maintaining the front end gain value and reducing the baseband gain value;
when the peak detector and saturation detector inputs are (1,0) respectively, reducing the front end gain value and maintaining the baseband gain value; and
when the peak detector and saturation detector inputs are (1,1) respectively, maintaining the front end gain value and reducing the base gain value.

26. The automatic gain control circuit of claim 23, further comprises a digital power measurement input to receive a measured power level of the received signal.

27. The automatic gain control circuit of claim 26, wherein the gain calculation result generates the front end gain value and baseband gain value based on the measured power level if both peak detector and saturation detector inputs are low.

28. The automatic gain control circuit of claim 23, wherein the automatic gain control circuit is a state machine.

* * * * *